United States Patent
Sharan et al.

(10) Patent No.: US 6,284,651 B1
(45) Date of Patent: *Sep. 4, 2001

(54) METHOD FOR FORMING A CONTACT HAVING A DIFFUSION BARRIER

(75) Inventors: Sujit Sharan; Varatharajan Nagabushnam, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/273,118

(22) Filed: Mar. 19, 1999

Related U.S. Application Data

(63) Continuation of application No. 08/997,428, filed on Dec. 23, 1997, now abandoned, which is a continuation of application No. 08/606,075, filed on Feb. 23, 1996, now Pat. No. 5,700,716.

(51) Int. Cl.$^7$ .................. H01L 21/4763; H01L 21/44
(52) U.S. Cl. .................. 438/649; 438/637; 438/643; 438/647; 438/648; 438/653; 438/655; 438/660; 438/684
(58) Field of Search .................. 438/532, 533, 438/517, 637–640, 643, 647, 649, 648, 653, 655, 657–660, 684

(56) References Cited

U.S. PATENT DOCUMENTS

| | | | |
|---|---|---|---|
| 4,624,864 | 11/1986 | Hartmann | 437/193 |
| 4,829,024 | 5/1989 | Klein et al. | 437/192 |
| 5,401,675 | 3/1995 | Lee et al. | 438/653 |
| 5,414,301 * | 5/1995 | Thomas | 257/740 |
| 5,420,074 | 5/1995 | Ohshima | 437/192 |
| 5,447,875 | 9/1995 | Moslehi | 437/200 |
| 5,451,545 | 9/1995 | Ramaswami et al. | 437/200 |
| 5,500,554 | 3/1996 | Sato | 257/588 |

FOREIGN PATENT DOCUMENTS

| | | |
|---|---|---|
| 62-014422 | 1/1987 | (JP) . |
| 62-219945 | 9/1987 | (JP) . |

OTHER PUBLICATIONS

S. Wolf, "Silcon Processing for the VLSI Era, vol. 1," Lattice Press, 1986, pp. 177–182.

* cited by examiner

Primary Examiner—John F. Niebling
Assistant Examiner—Ha Tran Nguyen
(74) Attorney, Agent, or Firm—Workman, Nydegger & Seeley

(57) ABSTRACT

Disclosed is a novel contact structure comprising an underlying layer of titanium silicide, an intermediate layer of titanium boride, and an overlying layer of polysilicon. Also disclosed is a method for forming the contact structure which comprises depositing a titanium layer in the bottom of a contact opening having oxide insulation sidewalls, forming an overlying layer of polysilicon above the titanium layer, and annealing the two layers together. The resulting contact structure is formed with fewer steps than contact structures of the prior art and without the need for additional steps to achieve uniform sidewall coverage, due to high adhesion of the overlying layer of polysilicon with oxide insulation sidewalls of the contact opening. The contact structure has low contact resistance, and provides a suitable diffusion barrier due to a high melting point.

41 Claims, 4 Drawing Sheets

METHOD FOR FORMING A CONTACT HAVING A DIFFUSION BARRIER

This is a continuation patent application of U.S. patent application Ser. No. 08/997,428, filed on Dec. 23, 1997, now abandoned which is a continuation patent application of U.S. patent application Ser. No. 08/606,075, filed on Feb. 23, 1996, now Pat. No. 5,700,716 both of which are incorporated herein by reference.

BACKGROUND OF THE INVENTION

1. The Field of the Invention

The present invention relates to the formation of low contact resistance VLSI contacts, vias, and plugs. More specifically, the present invention is directed to a new structure for a low contact resistance contact, via, or plug having a diffusion barrier, as well as a method for creating such a structure.

2. The Relevant Technology

Recent advances in computer technology and in electronics in general have been brought about at least in part as a result of the progress that has been achieved by the integrated circuit industry in electronic circuit integration and miniaturization. This progress has resulted in increasingly compact and efficient semiconductor devices, attended by an increase in the complexity and number of such devices aggregated on a single integrated circuit wafer. The smaller and more complex devices, including resistors, capacitors, diodes, and transistors, have been achieved, in part, by reducing device sizes and spacing and by reducing the junction depth of active regions formed on a silicon substrate of an integrated circuit wafer. The smaller and more complex devices have also been achieved by stacking the devices at various levels on the wafer.

Among the feature sizes which are being reduced in size are the contact structures through which electrical contact is made between discrete semiconductor devices bn the varying levels of the wafer. These contact structures include contacts, vias, plugs, and other structures whereby electrical connection is made to discrete components of semiconductor devices located at the varying levels of integrated circuit wafers. In order to continue in the process of reducing integrated circuit size, however, new contact structure formation methods are required which overcome certain problems existing in the art.

For instance, contact structures have historically been formed from aluminum or aluminum alloy metallization. Aluminum, however, presents the problem of spiking. Spiking results in the dissolution of silicon from active regions of the semiconductor devices into the aluminum metallization and the dissolution of aluminum into the active regions. Spiking generally occurs as a result of the tendency of aluminum, when it contacts the silicon substrate directly at temperatures of about 450° C. or more, to eutectically alloy with the silicon substrate. When such a reaction occurs, silicon is dissolved into the aluminum, and there is a tendency for silicon thus dissolved to be precipitated at a boundary between the metallization layer and the active region as an epitaxial phase. This increases the resistivity across the contact structure. Furthermore, aluminum is diffused into the active region from the metallization layer and forms an alloy spike structure which can cause unwanted short circuit conduction between the active region and the underlying silicon substrate.

Contact openings have more recently been metallized with tungsten with the formation of what is known as a "tungsten plug." The tungsten plug formation process does not incur spiking, but has proven problematic for other reasons, however, and these problems are heightened by the continuous miniaturization of the integrated circuit and the modern "stacked" construction of such circuits.

The tungsten plug is typically deposited by CVD in an atmosphere of fluorine, which attacks silicon, creating "worm holes" into the active region. Worm holes can be formed from this reaction extending completely through the active region, thereby shorting it out and causing the device to fail. As a further problem associated with the tungsten plug structure, the tungsten metallization complicates the contact formation process because it does not adhere well directly to silicon or oxide.

In order to eliminate the problems associated with the reaction between the silicon substrate and the metallization material, prior art methods have typically employed a diffusion barrier structure which is provided between the metallization material and the active region and which blocks the reaction between the active region and the metallization material. The diffusion barrier prevents the interdiffusion of silicon and aluminum. It also provides a surface to which the tungsten will adhere and prevents fluorine from diffusing into the active region.

Prior art FIGS. 1 through 4 of the accompanying drawings depict one conventional method known in the art of forming contact structures having a diffusion barrier. As shown in FIG. 1, a contact opening 18 is first etched through an insulating layer 16 overlying an active region 14 on a silicon substrate 12. Insulating layer 16 typically comprises a passivation material of intentionally formed silicon dioxide in the form of borophosphosilicate glass (BPSG). Contact opening 18 provides a route for electrical communications between active region 14 and the surface of insulating layer 16. As shown in FIG. 2, a titanium layer 22 is sputtered over contact opening 18 in a further step, and coats the exposed surface of active region 14.

A high temperature anneal step is then conducted in an atmosphere of predominantly nitrogen gas ($N_2$). Titanium layer 22 reacts with active region 14 during the anneal and is transformed into a dual layer. In forming the new dual layer, the lower portion of titanium layer 22 overlying active region 14 reacts with a portion of the silicon in active region 14 to form a titanium silicide ($TiSi_x$) region 26 seen in FIG. 3. Concurrently, the upper portion of titanium layer 22 reacts with the nitrogen gas of the atmosphere to form a titanium nitride ($TiN_x$) layer 24 also seen in FIG. 3. Titanium silicide layer 26 provides a conductive interface at the surface of active region 14. Titanium nitride layer 24 formed above titanium silicide layer 26 acts as a diffusion barrier to the interdiffusion of tungsten and silicon, or aluminum and silicon, as mentioned above.

The next step, shown in FIG. 4, is deposition of the metallization layer. In Tungsten plug formation, metallization is achieved by the chemical vapor deposition of tungsten to form metallization layer 20. Titanium nitride layer 24 helps improve the adhesion between the walls of the opening and the tungsten metallization material. It also acts as a barrier against the diffusion of metallization layer 20 into the active region 14, and vice-versa.

It should be apparent from the above discussion that tungsten plug formation is an involved and time consuming process. Accordingly, one drawback of the tungsten plug structure, like most other contact structures of the prior art, is the many steps required for forming it. The high number of steps is due to, among other things, the need to form a diffusion barrier in the contact opening and the difficulty of doing so while maintaining consistent sidewall coverage.

A further problem involved with the tungsten plug structure is the poor step coverage provided by current tungsten plug formation methods. FIG. 5 depicts the results of a typical attempt to deposit tungsten over titanium nitride layer 24. Cupping, or "bread loafing", of tungsten metallization layer 20 on the surface of contact opening 18, seen in FIG. 5, is a typical problem in the depicted prior art process flow step. A result of the cusping is that the contact is closed off, and cannot be completely filled. Incomplete filling results in a void area, also known as a "keyhole," that is formed within tungsten metallization layer 20. This keyhole is detrimental because it can open up during further processing steps, where material which could corrode or corrupt the tungsten layer can make its way into the keyhole. Also, the void in the center of the conducting metallization layer in the contact causes an increase in contact resistance.

As a further problem associated with the tungsten plug structure, titanium nitride layer 24, which is necessary as a diffusion barrier, has relatively high resistivity. The higher resistivity raises the contact resistance of the contact structure, which in turn has a tendency to lower the speed of the semiconductor devices being formed.

Thus, it is apparent that a contact structure and a corresponding method for forming the contact structure are needed which overcome the problems existing in the prior art. Specifically, a contact structure is needed which has a low resistivity for creating a contact structure with low contact resistance, which structure can form a sufficient diffusion barrier, and which adheres well to oxide sidewalls such that sidewall coverage of an intermediate material is not needed. A method of forming the contact structure is also needed which can be conducted with fewer steps than the methods of the prior art, and which provides better step coverage of the metallization layer in the contact opening.

SUMMARY AND OBJECTS OF THE INVENTION

The present invention seeks to resolve the above and other problems which have been experienced in the art. More particularly, the present invention constitutes an advancement in the art by providing a contact structure for an in-process integrated circuit wafer and a method of making the contact structure which achieve each of the objects listed below.

It is an object of the present invention to provide a contact structure which adheres well to oxide and thus does not require sidewall coverage of an intermediate layer.

It is likewise an object of the present invention to provide such a contact structure which has a high melting point and thus provides a suitable diffusion barrier.

It is also an object of the present invention to provide such a contact structure which provides a low contact resistance.

It is a further object of the present invention to provide a method for forming a contact structure which results in a contact structure that meets each of the aforementioned objects and requires fewer steps to construct than prior art methods It is yet another object of the present invention to provide such a method for forming a contact structure which results in desirable step coverage of the metallization material in the contact opening.

To achieve the foregoing objects, and in accordance with the invention as embodied and broadly described herein in the preferred embodiment, a contact structure is provided, as well as a method for forming the contact structure on an in-process integrated circuit wafer. The contact structure is well suited for use as a substitute for conventional contacts, vias, and plugs, and particularly as a replacement for the tungsten plug of the prior art. Many of the problems of the prior art are avoided by the novel contact structure of the present invention and corresponding method for forming the contact structure.

The novel contact structure is formed under the inventive method in which the first step comprises depositing a layer of titanium on a surface wherein a diffusion barrier is required. Typically, this surface will be the bottom of a contact opening which has been etched through an insulating layer to provide access to a discrete component of a semiconductor device such as a diode, capacitor, or transistor. The titanium deposition step preferably comprises PVD (e.g. sputtering) or CVD. The titanium layer is preferably deposited to have a thickness in a range of about 200 Angstroms to about 300 Angstroms.

In a further step, an overlying layer of polysilicon heavily doped with boron is formed above the titanium layer. The polysilicon layer is preferably formed by pyrolitic reaction from one of two precursors, silane ($SiH_4$) or disilane ($Si_2H_6$) in an atmosphere of $B_2H_6$. A layer having a thickness in a range of about 6000 Angstroms to about 7000 Angstroms is preferably formed by the reaction.

Finally, the titanium and polysilicon layers are annealed. The annealing is preferably conducted using a rapid thermal anneal in a rapid thermal processing (RTP) chamber. The anneal step causes a rearrangement of the titanium and polysilicon layers into a resulting contact structure comprising three layers.

The resulting three layer contact structure comprises an underlying layer of titanium silicide, an intermediate layer of titanium boride, and an upper layer of polysilicon. This structure can be formed using fewer steps than are required for methods of the prior art for forming contact structures, due to the fact that polysilicon adheres well to oxide insulation sidewalls, such that sidewall coverage of an intermediate layer is unnecessary. Also, step coverage is improved, as the problems of bread loafing and cusping are overcome by the lack of an intermediate layer. In addition, an effective diffusion barrier as well as low contact resistance are provided by the contact structure.

BRIEF DESCRIPTION OF THE DRAWINGS

In order that the manner in which the above-recited and other advantages and objects of the invention are obtained will be understood, a more particular description of the invention briefly described above will be rendered by reference to a specific embodiment thereof which is illustrated in the appended drawings. Understanding that these drawings depict only a typical embodiment of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
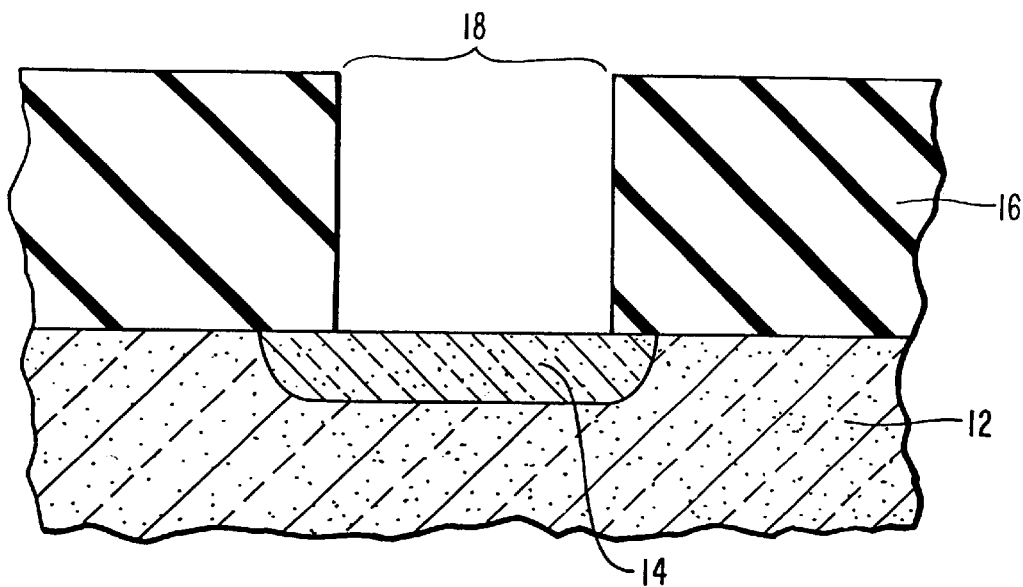
FIG. 1 is a cross-sectional elevation view showing a first step of a representative method of the prior art in which a contact structure is formed in a contact opening through an insulative layer down to an active region on an in-process integrated circuit wafer.
Figure 2:
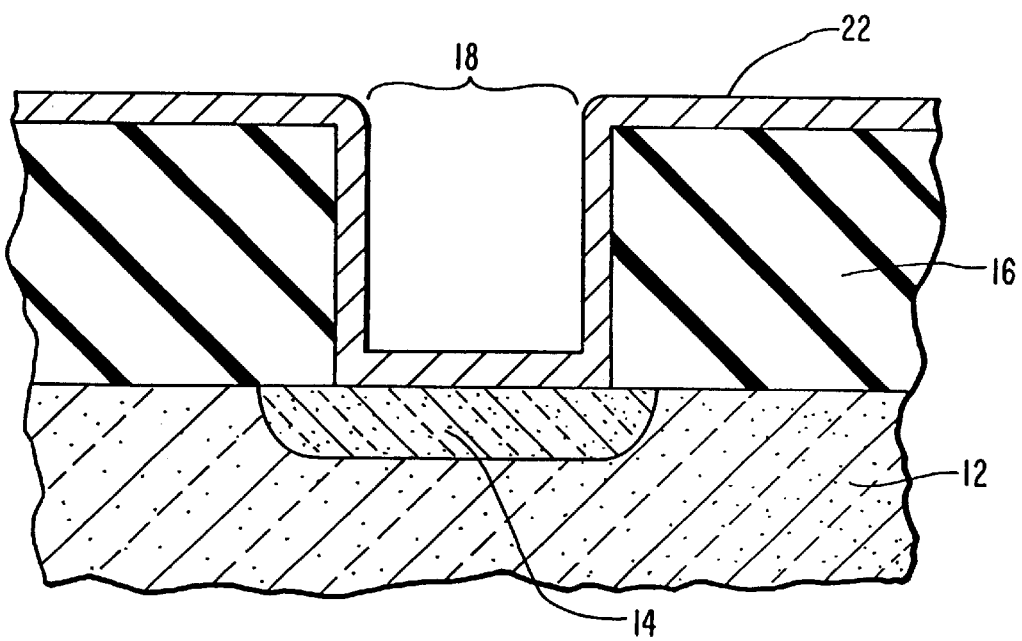
FIG. 2 is a cross-sectional elevation view illustrating the next step in the prior art method of FIG. 1, comprising depositing a layer of titanium into the contact opening.
Figure 3:
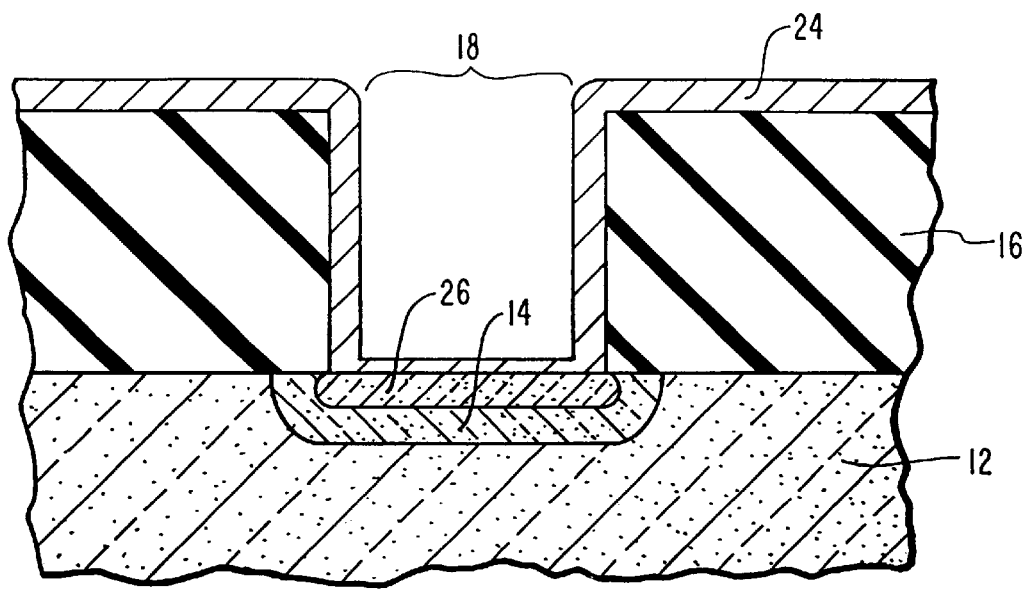
FIG. 3 is a cross-sectional elevation view illustrating the next step in the prior art method of FIGS. 1 and 2, comprising annealing the titanium layer in a nitrogen gas atmosphere to form a resulting structure having an underlying titanium silicide region and an overlying titanium nitride layer.
Figure 4:
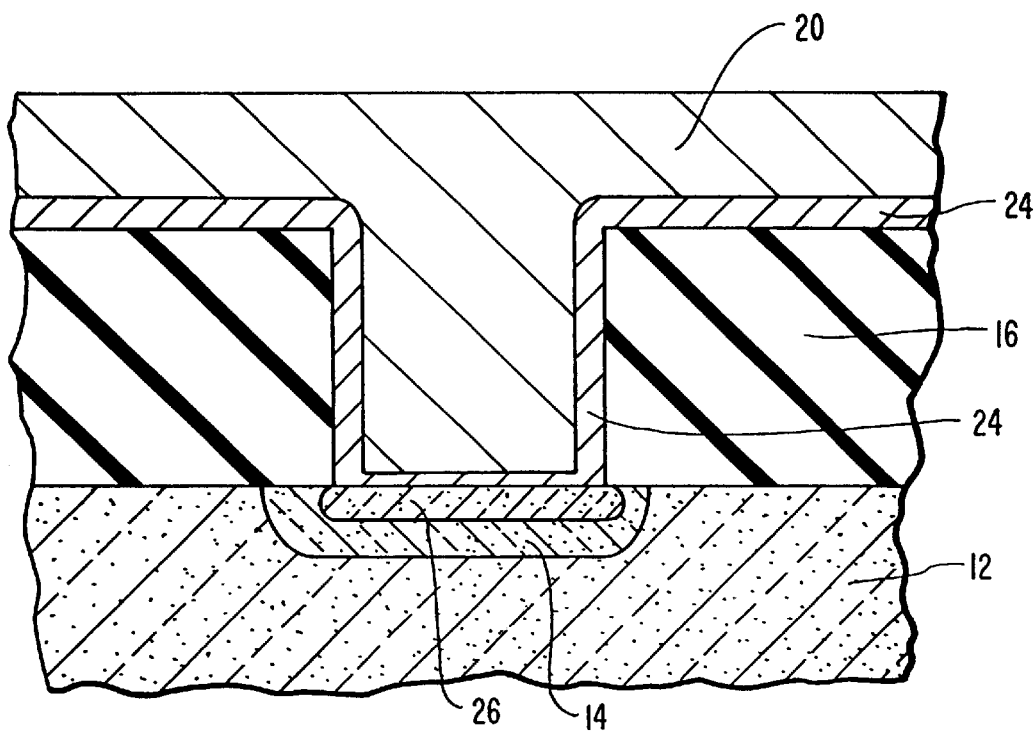
FIG. 4 is a cross-sectional elevation view illustrating the final step of the prior art method of FIGS. 1 through 3, comprising metallizing over the contact opening and underlying layers.
Figure 5:
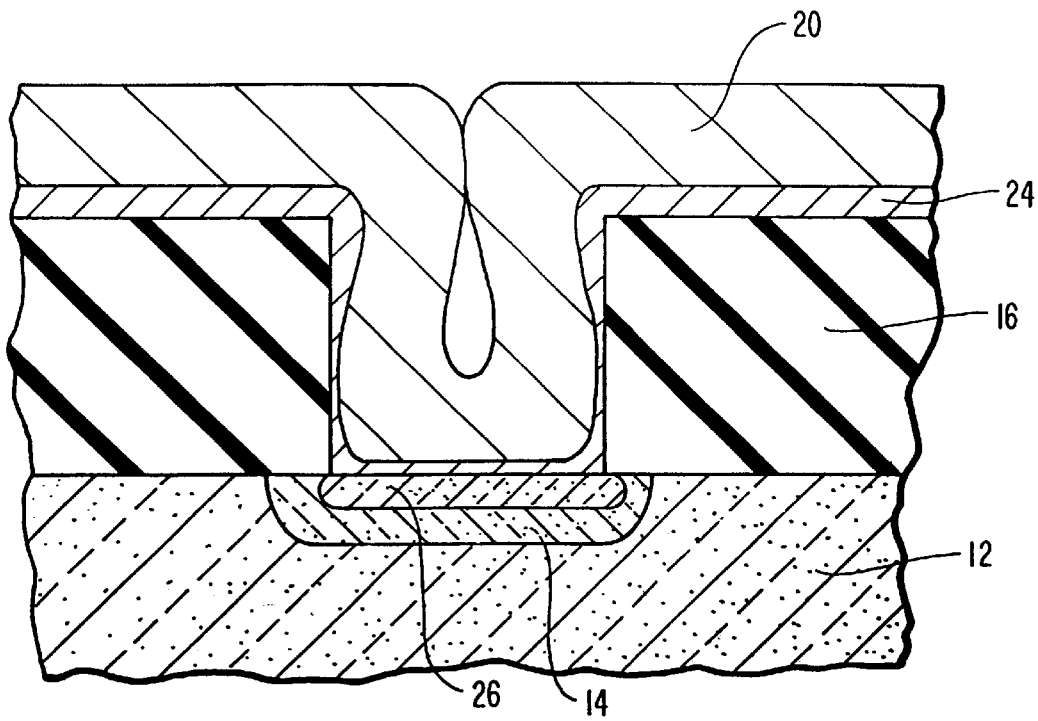
FIG. 5 is a cross-sectional elevation view illustrating a typical problem encountered by the prior art when producing an contact structure, and depicts cusping at the top of the contact layer as well as a keyhole at the center thereof.
Figure 6:
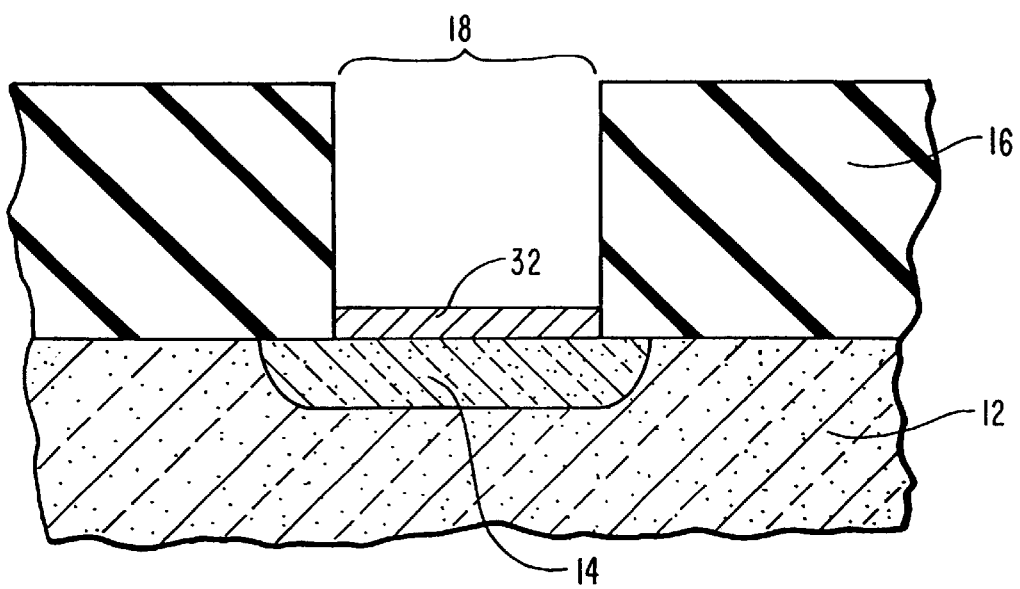
FIG. 6 is a cross-sectional elevation view of one step of the method of the present invention, comprising depositing a layer of titanium in the bottom of a contact opening.

A more detailed discussion of the present invention will now be made by referring to FIGS. 6 through 8 of the accompanying drawings. Therein is illustrated one embodiment of the method of the present invention for forming a contact structure. As shown in FIG. 6, a preliminary step comprises forming a contact opening 18 through an insulative layer 16 down to a semiconductor device on a silicon substrate 12 of an in-process integrated circuit wafer. The method of the present invention can be used to provide electrical contact to any discrete component of a semiconductor device or such structure, which requires a diffusion barrier.

In FIG. 6, contact opening 18 is shown providing access to an active region 14 of a discrete semiconductor device to which electrical communication must be provided. Active region 14, which is depicted as a semiconductor device in the Figures, will typically comprise a gate structure of a MOS transistor, a capacitor electrode, a resistor, or a portion of a bipolar junction transistor. Of course, the contact structure of the present invention could also be used to provide electrical communication to surfaces which require a diffusion barrier, but which do not require a contact opening.

A further step of the present invention as herein embodied, also illustrated in FIG. 6, comprises forming a titanium layer 32 in the bottom of a contact opening 18 or on a surface where a diffusion barrier is needed. The term "contact opening" as used herein is intended to include the designation of an opening by which electrical connection is made between semiconductor devices on separate levels of the integrated circuit wafer. Accordingly, openings for forming contacts, as well as vias and plugs are included within the scope thereof.

The titanium layer can be formed by any adequate layer formation method known in the art. The titanium for the titanium layer will be deposited by chemical vapor deposition (CVD) or physical vapor deposition (PVD) through a collimator, where the most preferred deposition method is PVD sputtering. Titanium layer 32 is preferably deposited with a thickness, for contact structures of current integration size and levels, in a range of about 200 Angstroms to about 300 Angstroms. Of course, one skilled in the art will be able to easily vary the relevant dimensions to fit the particular application.

Figure 7:
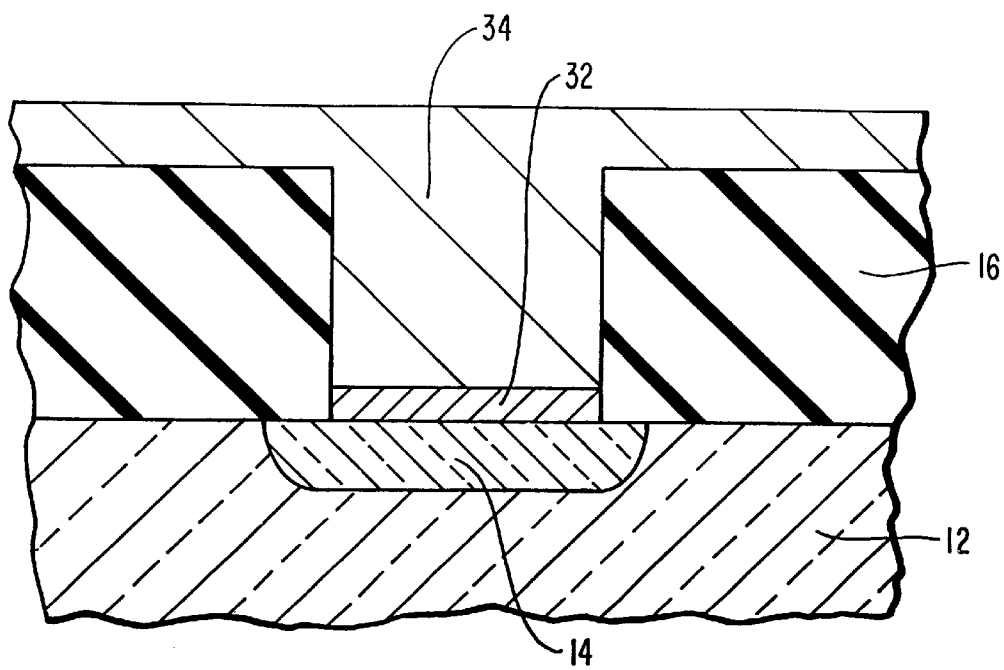
FIG. 7 is a cross-sectional elevation view illustrating a later step of the method of the present invention, comprising depositing a layer of polysilicon doped with boron over the titanium layer in the contact opening.

The next step in the preferred embodiment of the present invention is illustrated in FIG. 7, and comprises forming an overlying layer of polysilicon 34 above titanium layer 32 in the contact opening or other surface. Polysilicon layer 34 is preferably heavily doped with boron and is preferably formed to have a thickness in a range of about 6000 Angstroms to about 7000 Angstroms. Any adequate known method may be used to form polysilicon layer 34, but it is preferred that polysilicon layer 34 be deposited by pyrolitic reaction from one of two precursors. One preferred precursor is silane ($SiH_4$). Silane is preferably reacted in the current embodiment in an atmosphere of $B_2H_6$, which provides boron doping of the resulting polysilicon layer. The reaction is conducted at a temperature of about 630° C. to about 650° C., and at a pressure of about 80 Torr and for a time period of about 300 seconds. A second preferred precursor comprises disilane ($Si_2H_6$). Disilane is preferably reacted in an atmosphere of $B_2H_6$, at a temperature of about 550° C. to about 570° C., a pressure of about 80 Torr and for a time period of about 150 seconds.

Most preferred of the two stated precursor methods is the disilane precursor method, as it provides a more uniform step coverage and can be conducted at a lower temperature and for a shorter period of time. Nevertheless, use of the disilane precursor is a less stable and a less understood process, and may be more difficult to accomplish. Either method will provide more uniform step coverage than the tungsten plug method of the prior art discussed above. Appropriate concentrations of silane or disilane and $B_2H_6$ are selected in the process to provide a layer of polysilicon which is heavily doped with a concentration of about $1 \times 10^{20}$ to about $5 \times 10^{20}$ atoms per cubic centimeter of polysilicon.

The final step in the preferred embodiment of the present invention comprises annealing titanium layer 32 and polysilicon layer 34. The annealing step can be conducted using any known method, but is preferably conducted with a rapid thermal anneal procedure (RTA) in a rapid thermal processing (RTP) chamber. The RTA is preferably conducted at a temperature of about 800° C. to about 950° C. and for a time period of about 20 seconds. Alternatively, a furnace anneal could be conducted, using a furnace such as a tube furnace. In the case of the use of a tube furnace, the anneal would be conducted in a predominantly argon atmosphere, at a temperature of around 800° C. to about 900° C. and for a time period of about 30 minutes. As a result of the anneal step, a reaction occurs in which titanium layer 32 and polysilicon layer 34 react together and form a resulting structure comprising three layers.

Figure 8:
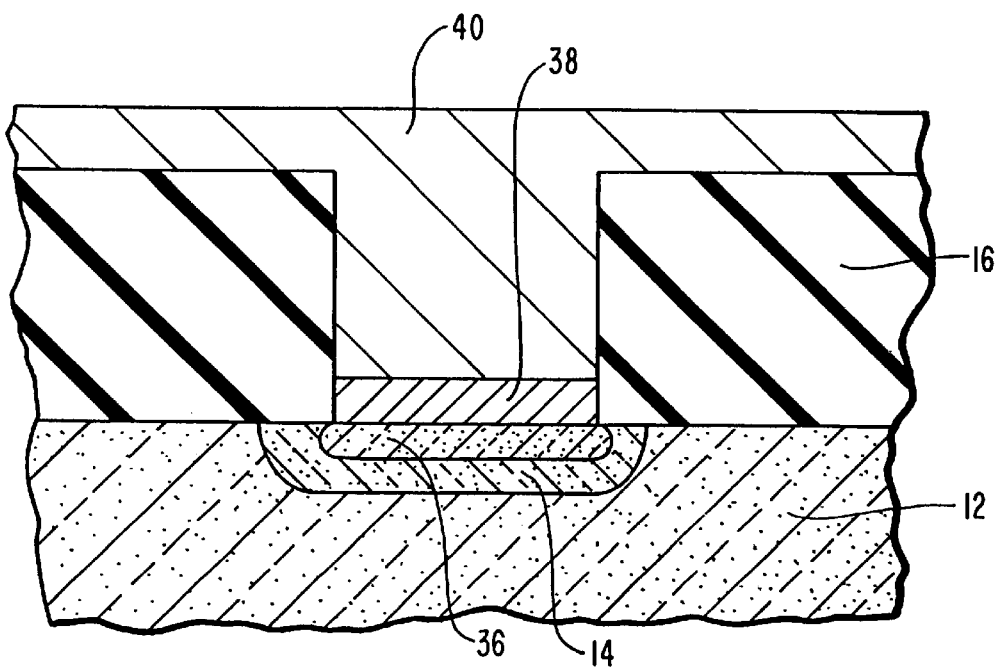
FIG. 8 is a cross-sectional elevation view illustrating a further step of the method of the present invention, comprising annealing the titanium and polysilicon layers to form a resulting three layer contact structure.

The structure resulting from the reaction caused by the anneal step of the present invention is shown in FIG. 8. FIG. 8 shows an underlying layer of titanium silicide ($TiSi_x$) 36, which is preferably of approximately 200 Angstroms thick. Titanium silicide layer 36 provides a conductive interface with underlying active region 14. Above titanium silicide layer 36 is a titanium boride layer ($TiB_x$) 38. Titanium boride layer 38, when formed under the proper concentrations and parameters, preferably comprises titanium diboride ($TiB_2$).

Titanium boride is a refractory metal which has low resistivity and will provide a low contact resistance. It also has a high melting point, and thus functions as a suitable diffusion barrier. The thickness of titanium boride layer 38 is preferably approximately 250 Angstroms. The remainder of the contact will be filled with a polysilicon layer 40, which retains a high concentration of boron dopants after the anneal step for greater conductivity. Polysilicon layer 40 adheres well to oxide sidewalls, and consequently, no sidewall coverage of an intermediate layer, such as TiN, is needed for the metallization layer to adhere well to the oxide of insulation layer 16 of the sidewall of contact opening 18. Also, as the boron in polysilicon layer 34 prefers to interact with titanium, little interdiffusion with underlying active region 14 has been found to occur during the anneal step.

The semiconductor device contact structure of FIG. 8 can be used in a number of ways, including as a replacement for prior art contacts, vias, and plug structures. It has been found advantageous for use in replacing tungsten plugs. The contact structure is also advantageous for providing electrical communication to semiconductor devices such as the active regions of transistors and diodes, word or bit lines of DRAM memory structures, capacitors, and metal interconnect lines on the surface of integrated circuit wafers.

Thus, it can be seen that, as herein described and embodied, the resulting structure of FIG. 8 provides a contact structure which can be formed using fewer steps than the contact structures of the prior art, and without the need for uniform sidewall coverage of an intermediate layer in order to adhere well to oxide insulation sidewalls. The resulting contact structure provides a higher degree of step coverage than prior art methods, and forms a sufficient diffusion barrier with a high melting point such that dopants and metallization material from the contact structure cannot diffuse into the underlying active regions or vice versa. Furthermore, the resulting contact structure provides low contact resistance, and can be used for effectively providing electrical connection between semiconductor devices, components, and structures.

The present invention may be embodied in other specific forms without departing from its spirit or essential characteristics. The described embodiment of the novel structure and inventive methods are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of forming a contact structure, the method comprising:
   forming a contact opening through an insulating layer, wherein the contact opening has a bottom and has a sidewall defined by the insulating layer, the bottom of the contact opening at a silicon substrate;
   forming, in an atmosphere devoid of fluorine, a layer of a refractory metal on the bottom of the contact opening;
   forming, in the contact opening, a layer of an electrically conductive silicon-containing material in contact with the layer of the refractory metal and the sidewall; and
   heating the refractory metal and the silicon-containing material to form a structure in the contact opening comprising:
   a refractory metal silicide layer located in the bottom of the contact opening;
   a refractory metal boride layer located on the refractory metal silicide layer in the contact opening; and wherein
   the layer of silicon-containing material fills the remainder of the contact opening.

2. A method as recited in claim 1, wherein:
   the insulating layer comprises an oxide; and
   the silicon-containing material adheres to the oxide of the sidewall.

3. A method as recited in claim 1, wherein the layer of refractory metal is formed by chemical vapor deposition.

4. A method as recited in claim 1, wherein the layer of refractory metal is formed with a thickness in a range of about 200 Angstroms to about 300 Angstroms.

5. A method as recited in claim 1, wherein the layer of electrically conductive silicon-containing material is formed with a thickness in a range of about 6000 Angstroms to about 7000 Angstroms.

6. A method as recited in claim 1, wherein the silicon-containing material is doped with a range of about $1 \times 10^{20}$ to about $5 \times 10^{20}$ atoms of boron per cubic centimeter of silicon-containing material.

7. A method as recited in claim 1, wherein said heating comprises conducting a rapid thermal anneal in a rapid thermal processing chamber at a temperature in a range of about 800° C. to about 950° C.

8. A method as recited in claim 1, wherein said heating comprises heating in a tube furnace having a temperature in a range of about 800° C. to about 900° C. in a predominantly argon atmosphere.

9. A method as recited in claim 1, wherein the layer of electrically conductive silicon-containing material is formed from a silane precursor.

10. A method as recited in claim 9, wherein the layer of electrically conductive silicon-containing material is formed from the silane precursor in an atmosphere of $B_2H_6$, at a temperature in a range of about 630° C. to about 650° C.

11. A method as recited in claim 1, wherein the layer of electrically conductive silicon-containing material is formed from a disilane precursor.

12. A method as recited in claim 11, wherein the layer of electrically conductive silicon-containing material is formed from the disilane precursor in an atmosphere of $B_2H_6$, at a temperature in a range of about 550° C. to about 570° C.

13. A method as recited in claim 1, wherein the layer of refractory metal in the bottom of the contact opening adheres to the sidewall defined by the insulating layer.

14. A method as recited in claim 1, wherein said silicon-containing material is made electrically conductive by doping with boron.

15. A method as recited in claim 1, wherein the layer of refractory metal is formed by physical vapor deposition.

16. A method as recited in claim 15, wherein said physical vapor deposition is through a collimator.

17. A method as recited in claim 1, wherein the refractory metal is titanium.

18. A method of forming a contact structure to provide electrical communication to a semiconductor device on an in-process integrated circuit substrate, the method comprising:
   forming a contact opening through an oxide layer above the semiconductor device;
   forming, in an atmosphere devoid of fluorine, a layer of refractory metal in the bottom of the contact opening, the layer of refractory metal having a thickness in a range of about 200 Angstroms to about 300 Angstroms;
   forming a layer of electrically conductive silicon-containing material on the layer of refractory metal, the layer of electrically conductive silicon-containing material having a thickness in a range of about 6000 to about 7000 Angstroms, the layer of electrically conductive silicon-containing material being doped in a concentration range of about $1\times10^{20}$ to about $5\times10^{20}$ dopant atoms per cubic centimeter of electrically conductive silicon-containing material; and annealing the in-process integrated circuit substrate with a rapid thermal anneal in a rapid thermal processing chamber at a temperature in the range from about 800° C. to about 950° C.

19. A method as recited in claim 18, wherein:
the bottom of the contact opening is defined by a silicon substrate;
said annealing forms a contact structure in the contact opening comprising:
   a refractory metal silicide layer in the bottom of the contact opening; and
   a refractory metal boride layer on the refractory metal silicide layer; and wherein:
      the dopant atoms are boron; and
      said layer of said electrically conductive silicon-containing material fills the remainder of the contact opening and has a thickness in a range of about 6000 to about 7000 Angstroms.

20. A method as recited in claim 18, wherein the layer of refractory metal in the bottom of the contact opening adheres to the oxide of a sidewall of the contact opening in the oxide layer.

21. A method as recited in claim 18, wherein the layer of refractory metal is formed by chemical vapor deposition.

22. A method as recited in claim 18, wherein the layer of refractory metal is formed by physical vapor deposition.

23. A method as recited claim 22, wherein said deposition of said refractory metal by physical vapor deposition is a deposition through a collimator.

24. A method as recited in claim 18, wherein the temperature at which the annealing the in-process integrated circuit substrate with a rapid thermal anneal in a rapid thermal processing chamber is performed is within the range from about 900° C. to about 950° C.

25. A method as recited in claim 18, wherein the refractory metal is titanium.

26. A method of forming a contact structure to provide electrical communication to a semiconductor device on an in-process integrated circuit substrate, the method comprising:
forming a contact opening through an insulating layer above the semiconductor device, wherein the contact has a bottom and defines a sidewall in the insulating layer, the insulating layer comprising oxide;
forming, in an atmosphere devoid of fluorine, a layer of refractory metal in the bottom of the contact opening;
forming a layer of electrically conductive silicon-containing material on the layer of refractory metal in the contact opening, the layer of electrically conductive silicon-containing material being doped, and wherein the layer of electrically conductive silicon-containing material adheres to the oxide of the sidewall in the insulating layer and is formed from a disilane precursor in an atmosphere of $B_2H_6$ at a temperature in a range of about 550° C. to about 570° C.; and
annealing the in-process integrated circuit substrate.

27. A method as recited in claim 26, wherein the layer of refractory metal is formed with a thickness in a range of about 200 Angstroms to about 300 Angstroms.

28. A method as recited in claim 26, wherein the layer of electrically conductive silicon-containing material is formed with a thickness in a range of about 6000 Angstroms to about 7000 Angstroms.

29. A method as recited in claim 26, wherein the layer of electrically conductive silicon-containing material is doped with a range of about $1\times10^{20}$ to about $5\times10^{20}$ atoms of boron per cubic centimeter of electrically conductive silicon-containing material.

30. A method as recited in claim 26, wherein annealing the in-process integrated circuit substrate comprises conducting a rapid thermal anneal in a rapid thermal processing chamber at a temperature in a range of about 800° C. to about 950° C.

31. A method as recited in claim 26, wherein annealing the in-process integrated circuit substrate comprises placing the in-process integrated circuit substrate in a furnace having a temperature in a range of about 800° C. to about 900° C. in a predominantly argon atmosphere.

32. A method as recited in claim 26, wherein the layer of refractory metal in the bottom of the contact opening adheres to the oxide of the sidewall in the insulating layer.

33. A method as recited in claim 26, wherein the layer of refractory metal is formed by chemical vapor deposition.

34. A method as recited in claim 26, wherein the layer of refractory metal is formed by physical vapor deposition.

35. A method as recited in claim 34, wherein said deposition of said refractory metal by physical vapor deposition is a deposition through a collimator.

36. A method as recited in claim 26, wherein the refractory metal is titanium.

37. A contact structure formation method comprising:
forming an insulator upon a silicon substrate;
forming a contact hole extending through the insulator to the silicon substrate;
forming, in an atmosphere devoid of fluorine, a refractory metal on the silicon substrate to partially fill the contact hole;
filling up the contact hole with a silicon-containing material that:
   is made electrically conductive by a dopant; and
   is upon the refractory metal within the contact hole;
forming by heat:
   a refractory metal silicide within the silicon substrate that is both below and aligned with the contact hole; and
   a compound within the contact hole including both the refractory metal and the dopant.

38. A method as recited in claim 37, wherein the refractory metal is titanium.

39. A contact structure formation method comprising:
forming an insulator upon a silicon substrate;
forming a contact hole extending through the insulator to the silicon substrate;
forming in an atmosphere devoid of fluorine:
   a refractory metal silicide within the silicon substrate and both below and aligned with the contact hole;
   a silicon-containing material made electrically conductive by a dopant and situated within the contact hole; and
   a compound of both the refractory metal and the dopant situated within the contact hole between the refractory metal silicide and the silicon-containing material.

40. A method as recited in claim 39, wherein the refractory metal is titanium.

41. A method of forming a contact structure to provide electrical communication to a semiconductor device on an in-process integrated circuit substrate, the method comprising:

forming a contact opening through an insulating layer above the semiconductor device, wherein the contact opening has a bottom and defines a sidewall in the insulating layer, the insulating layer comprising oxide;

forming, in an atmosphere devoid of flooring, a layer of refractory metal in the bottom of the contact opening;

forming a layer of electrically conductive silicon-containing material on the layer of refractory metal in the contact opening, the layer of electrically conductive silicon-containing material being doped, and wherein the layer of electrically conductive silicon-containing material adheres to the oxide of the sidewall in the insulating layer and is formed from a silane precursor in an atmosphere of $B_2H_6$ at a temperature in a range of about 630° C. to about 650° C.; and annealing the in-process integrated circuit substrate.

* * * * *

UNITED STATES PATENT AND TRADEMARK OFFICE
CERTIFICATE OF CORRECTION

PATENT NO.    : 6,284,651 B1
DATED         : September 4, 2001
INVENTOR(S)   : Sujit Sharan and Varatharajan Nagabushnam It is certified that error appears in the above-identified patent and that said Letters Patent is hereby corrected as shown below:

Title page,
Item [56], U.S. PATENT DOCUMENTS, change "5,500,554" to -- 5,550,554 --

Column 1,
Line 38, after "devices" change "bn" to -- on --

Column 2,
Line 55, change "Tungsten" to -- tungsten --

Column 3,
Line 61, after "methods" insert -- . --

Column 5,
Line 13, before "contact" change "an" to -- a --

Column 6,
Line 60, after "preferably" delete [of]

Column 9,
Line 33, after "recited" insert -- in --

Column 11,
Line 5, change "flooring," to -- flourine, --

Signed and Sealed this

Seventh Day of May, 2002

Attest:

*Attesting Officer*

JAMES E. ROGAN
*Director of the United States Patent and Trademark Office*